United States Patent [19]

Morozumi

[11] Patent Number: 5,164,010
[45] Date of Patent: Nov. 17, 1992

[54] SOLDER COATING METHOD AND APPARATUS FOR SEMICONDUCTOR DEVICES

[75] Inventor: Taketo Morozumi, Nagano, Japan
[73] Assignee: Seiko Epson Corporation, Swa, Japan
[21] Appl. No.: 759,506
[22] Filed: Sep. 13, 1991

[30] Foreign Application Priority Data

Oct. 2, 1990 [JP] Japan .................. 2-262962
Aug. 27, 1991 [JP] Japan .................. 3-215259

[51] Int. Cl.⁵ .................. B05C 3/18; B23K 37/06
[52] U.S. Cl. .................. 118/406; 118/410; 118/429; 118/702; 228/37; 228/39
[58] Field of Search .............. 118/702, 406, 410, 419, 118/429; 228/11, 37, 39; 427/282, 431

[56] References Cited

U.S. PATENT DOCUMENTS

| | | | |
|---|---|---|---|
| 4,375,270 | 3/1983 | Minchev et al. | 228/37 |
| 4,523,708 | 6/1985 | Minchev et al. | 228/37 |
| 4,842,469 | 6/1989 | Schmidt | 118/410 X |
| 4,890,781 | 1/1990 | Johnson et al. | 228/11 X |
| 4,932,585 | 6/1990 | Nakamura | 118/429 X |
| 4,942,997 | 7/1990 | Sinkunas et al. | 228/39 X |
| 5,081,949 | 1/1992 | Berneur | 118/63 |

Primary Examiner—Michael G. Wityshyn
Attorney, Agent, or Firm—Ladas & Parry

[57] ABSTRACT

This invention relates to an apparatus for coating solder on the outer leads of TAB-type semiconductor devices. The solder coating apparatus comprises a solder tank accommodating a heater, a discharge tank having an open top and a solder inlet opening at a lower part thereof, a square pillar having a top of substantially the same or slightly greater size than a semiconductor element and arranged inside the discharge tank and projecting beyond the open top thereof, and a solder pressure feed screw near the inlet opening of the discharge tank. A film carrying semiconductor elements is intermittently stopped when one of the semiconductor elements arrives above the square pillar. Molten solder is discharged from gaps between the inner walls of the discharge tank and the square pillar onto the outer leads of the semiconductor element positioned over the pillar.

2 Claims, 5 Drawing Sheets

SOLDER COATING METHOD AND APPARATUS FOR SEMICONDUCTOR DEVICES

BACKGROUND OF THE INVENTION

1. Field of the Invention

This invention relates to a solder coating method for applying a solder to the outer leads of semiconductor devices and an apparatus therefor.

2. Description of the Prior Art

TAB-type semiconductor devices fabricated by mounting semiconductor elements on a flexible film such as a polyimide film and connecting their electrodes to the leads formed on the film, has a number of merits e.g., their suitability for mass production, their adaptability to miniaturization and their realizability of a fine pattern, and presently they are used widely.

In the plan view of FIG. 5 showing an example of the manufacturing process of the TAB-type semiconductor devices, numeral 1 designates a long film, 2 a plurality of device holes formed at regular intervals in the lengthwise direction of the film 1, and 3 a plurality of leads of a high-conductivity material such as copper foil formed on the film 1 with their forward ends being extended into corresponding one of the device holes 2 to form inner leads 3a. Numeral 4 designates sprocket holes for conveying the film 1. Numeral 5 designates a plurality of semiconductor elements each arranged within one of the device holes 2 and having a plurality of electrodes 6 connected to the inner leads 3a.

The film 1 having the semiconductor elements 5 connected in this way is cut off along mark-off lines 7 by a press or the like, thus producing the individual semiconductor devices. In this case, the leads on the outer side of each semiconductor element 5 are referred to as outer leads 3b. It is to be noted that there are cases where each semiconductor element 5 and a part of its outer leads 3a are packaged with a synthetic resin before the cutting.

While such semiconductor device is mounted on a substrate or a lead frame, in this case the reserve solder is usually applied to the outer leads 3b as shown by the hatching in FIG. 5 so as to facilitate positive connection thereof to the conductor pattern of the substrate or the leads of the lead frame.

FIGS. 7 and 8 are perspective views showing the conventional reserve solder coating method for TAB-type semiconductor devices. Numeral 8 designates a solder tank including discharge ports 9 and 9a on its longitudinal sides and inlet ports 8a in its bottom so that a molten solder 10 is introduced into the solder tank 8 through the inlet ports 8a to overflow through the discharge ports 9 and 9a for recirculation. The outer lead 3b portions on one side of the film 1 are dipped in the molten solder 10 and the film 1 is moved in the lengthwise direction, thus applying the solder 10 to the outer leads 3b. When the solder dipping of the outer leads 3b on one side is completed, the film 1 is turned upside down so that the outer leads 3b on the other side are dipped in the solder 10 and the film 1 is moved in the like manner, thereby applying the solder.

While the above-mentioned solder coating method is widely put in practical use owing to its merits such as the relatively simplified equipment and the increased soldering rate, the application of the solder by this conventional method is not possible in the case of a semiconductor device comprising a semiconductor element 5 having leads 3 connected to the four sides thereof as shown in FIG. 6.

SUMMARY OF THE INVENTION

The present invention has been made with a view to overcoming the foregoing problems and it is the primary object of the invention to provide a solder coating method and apparatus for semiconductor devices capable of easily applying a solder to semiconductor devices each comprising a semiconductor element having leads connected to the four sides thereof.

To accomplish the above object, in accordance with the present invention there is provided a solder coating method for semiconductor devices in which a film having semiconductor devices mounted thereon is moved above a solder tank including a pillar member having the top formed to have substantially the same or slightly greater size than the semiconductor elements and including a discharge port provided on each of the opposing two sides or four sides thereof on the outside of the pillar member whereby when one of the semiconductor elements arrives above the pillar member, the film is stopped and the molten solder is discharged from the discharge ports, thereby applying the solder to the outer leads formed on the film.

To perform the above-mentioned method, in accordance with the present invention there is provided a solder coating apparatus including a solder tank accommodating heating means, a discharge tank having an open top and an inlet opening for solder in the lower part thereof, a square pillar having a top formed to be substantially the same or slightly greater than the size of semiconductor elements and arranged within the discharge tank to slightly project from the opening thereof and form gaps between its outer walls and the inner walls of the discharge tank, and solder pressure feed means arranged near to the inlet opening of the discharge tank, conveying means for intermittently stopping a film, and a controller for controlling at least the heating means, the solder pressure feed means and the film conveying means.

In accordance with another form of the present invention, the apparatus is designed so that the gaps are formed only on the opposing two sides between the square pillar and the discharge tank.

When the film is taken up so that one of the semiconductor elements mounted thereon arrives above the square pillar, in response to a command from the controller the take-up reel is stopped and the semiconductor element is held above the square pillar. Then the pressure feed means is brought into operation so that the molten solder within the solder tank is forced into the discharge tank and discharged through between the square pillar and the discharge tank, thereby returning the molten solder into the solder tank. At this time, the discharged molten solder strikes against the outer leads positioned above the discharge tank, thereby forming a solder layer on the outer leads.

After the molten solder has been discharged for a given time, the pressure feed means is stopped and then the take-up reel is driven so that the next semiconductor element is stopped above the square pillar and the molten solder is again discharged. By successively repeating this operation, the solder is applied to the outer leads of the large number of semiconductor elements mounted on the long film.

On the other hand, the gaps are formed only on the two opposing sides between the square pillar and the discharge tank, thereby applying the solder to a film formed with outer leads only the two sides thereof.

DESCRIPTION OF THE PREFERRED EMBODIMENTS

Figure 1:
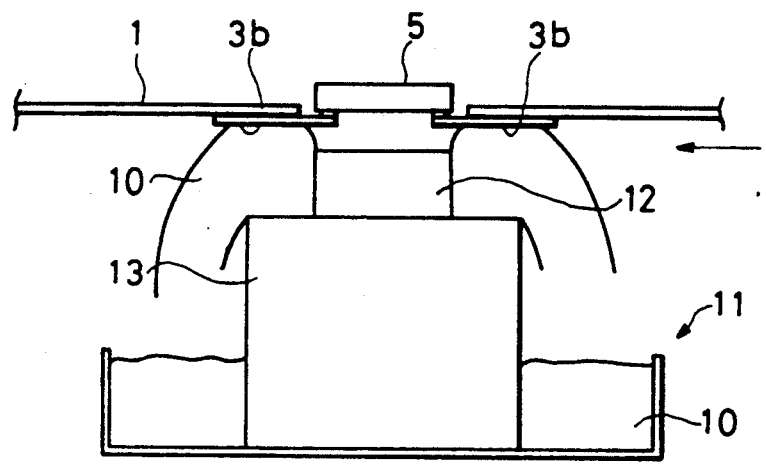
FIG. 1 is a schematic diagram for explaining an embodiment of a solder coating method according to the present invention.
Figure 2:
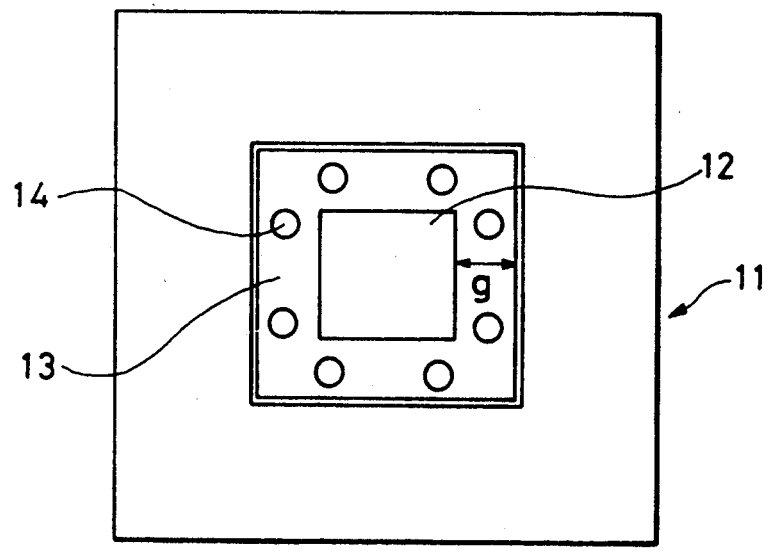
FIG. 2 is a plan view of an embodiment of the solder tank of FIG. 1.

FIG. 1 is a schematic diagram for explaining a solder coating method according to the present invention, and FIG. 2 is a plan view schematically showing an embodiment of the solder tank used with the present invention. In the Figures, numeral 11 designates a solder tank in which centrally arranged vertically is a square pillar 12 having a square shape in section, and a discharge tank 13 is opened so as to surround the square pillar 12 with gaps g being formed therebetween. Inlet ports 14 are formed in the bottom of the discharge tank 13. The size of the top of the square pillar 12 is made substantially equal to the size of the semiconductor element 5 of the semiconductor device of FIG. 6 or the size including the inner leads 3a, and the opening of the discharge tank 13 is made equal to the size extending substantially to the outer ends of the outer leads 3b. It is to be noted that the cross-sectional shape of the square pillar 12 is not limited to the square shape and it is sufficient to be similar in shape to the semiconductor elements 5, mounted on the film 1.

With the solder tank 11 constructed as described above, the molten solder 10 contained in the tank is discharged through the inlet ports 14 formed in the discharge tank 13, overflows between the square pillar 12 and the discharge tank 13 and returns to the solder tank 11 for recirculation.

Next, the operation of the present invention will be described with reference to FIG. 1. When the film 1 is conveyed for example in the direction of an arrow so that one of the semiconductor elements 5 arrives above the square pillar 12, it is stopped in this position. In this condition, a pump or the like (not shown) is operated on the solder tank 11 so that the molten solder 10 is forced out through the inlet ports 14 and the molten solder 10 is discharged in all directions along the outer walls of the square pillar 12 and the inner walls of the discharge tank 13. At this time, while the molten solder 10 overflows the discharge tank 13 and returns to the solder tank 11, a part of the molten solder 10 strikes against the film 1 and it is deposited on the outer leads 3a formed on the four sides of the film section.

After a given time has passed, the discharge of the molten solder is stopped and the film 1 is conveyed in the direction of the arrow, thereby stopping the next semiconductor element 5 above the square pillar 12 and applying the solder to its outer leads 3b in the same manner as mentioned above.

In accordance with this embodiment, the operation of feeding a film 1 having mounted thereon semiconductor elements 5 of 12 mm×9 mm at a feed rate of 120 cm/min, stopping the film 1 above a square pillar 12 having a square top of 13.5 mm×10.5 mm and discharging a molten solder 10 heated to 250°±5° C. at a discharge rate of 480 cm³/min through between the outer walls of the square pillar 12 and the inner walls of a discharge tank 13 for a period of 1 second resulted in the uniform deposition of the solder on outer leads 3a to a thickness of 20 μm and the extremely excellent results were obtained. Note that the gaps g between the discharge tank 13 and the square pillar 12 were 15 mm.

While the forgoing description is directed to the method of applying the solder to the outer leads of the TAB-type semiconductor devices, the present invention can be applied to semiconductor devices including semiconductor elements mounted on a lead frame by wire bonding.

Figure 5:
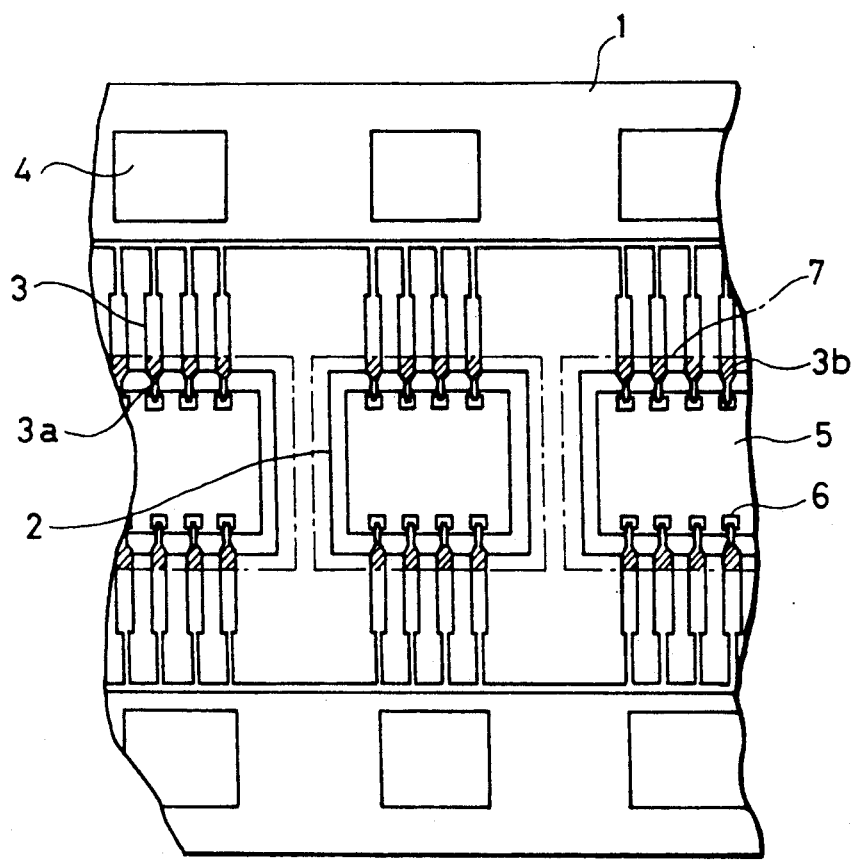
FIG. 5 is a plan view showing an example of the manufacturing process of the TAB-type semiconductor devices.
Figure 6:
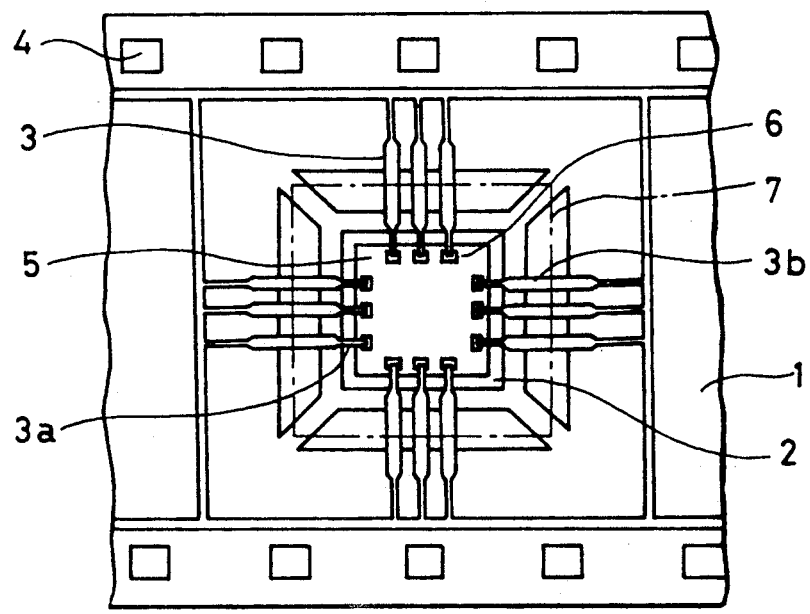
FIG. 6 is a plan view showing another example of the manufacturing process of the TAB-type semiconductor devices.
Figure 7:
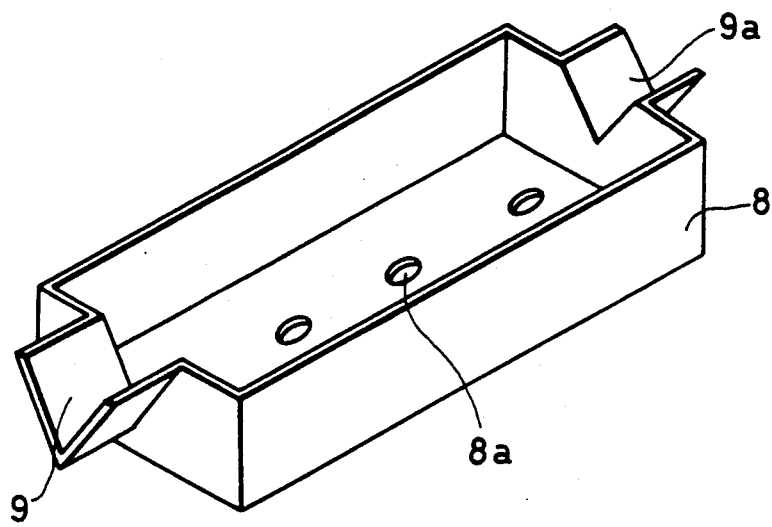
FIG. 7 is a perspective view showing an example of the solder tank used with the conventional solder coating.
Figure 8:
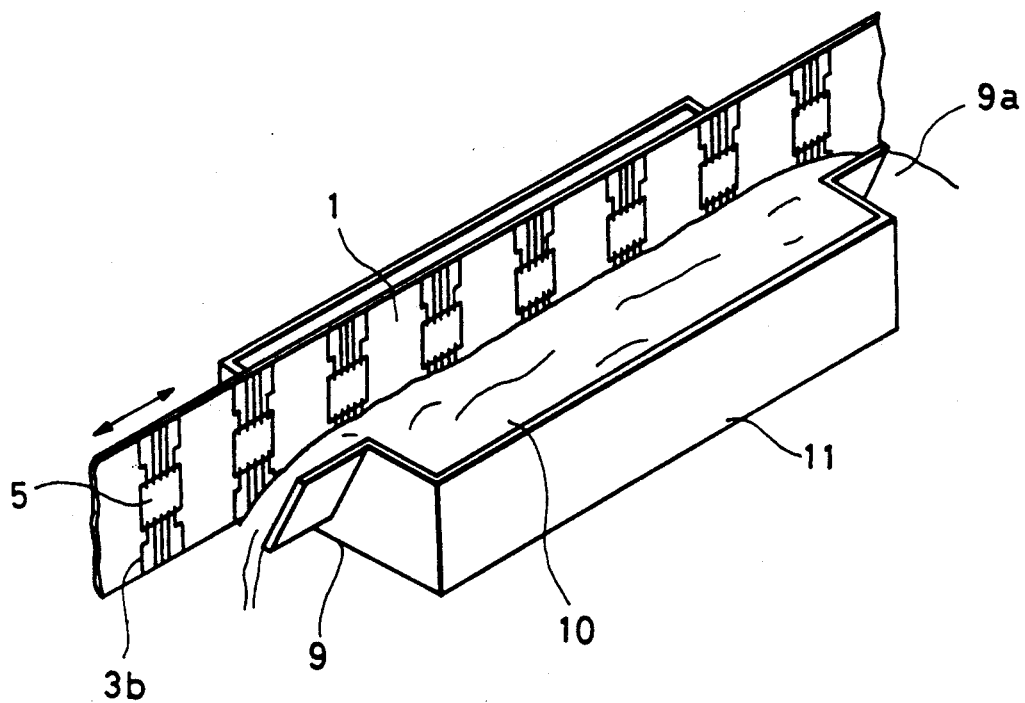
FIG. 8 is a perspective view showing an example of the conventional solder coating method.

Also, while, in the above description, the molten solder 10 is discharged from all the sides on the outer side of the square pillar 12 arranged within the solder tank 11 to apply the solder to the outer leads 3b formed on the four sides as shown in FIG. 6, by discharging the molten solder 10 from only the two sides on the outer side of the square pillar 12, the present invention can also be applied to a film 1 formed with outer leads 3b on the two sides as shown in FIG. 5.

Figure 3:
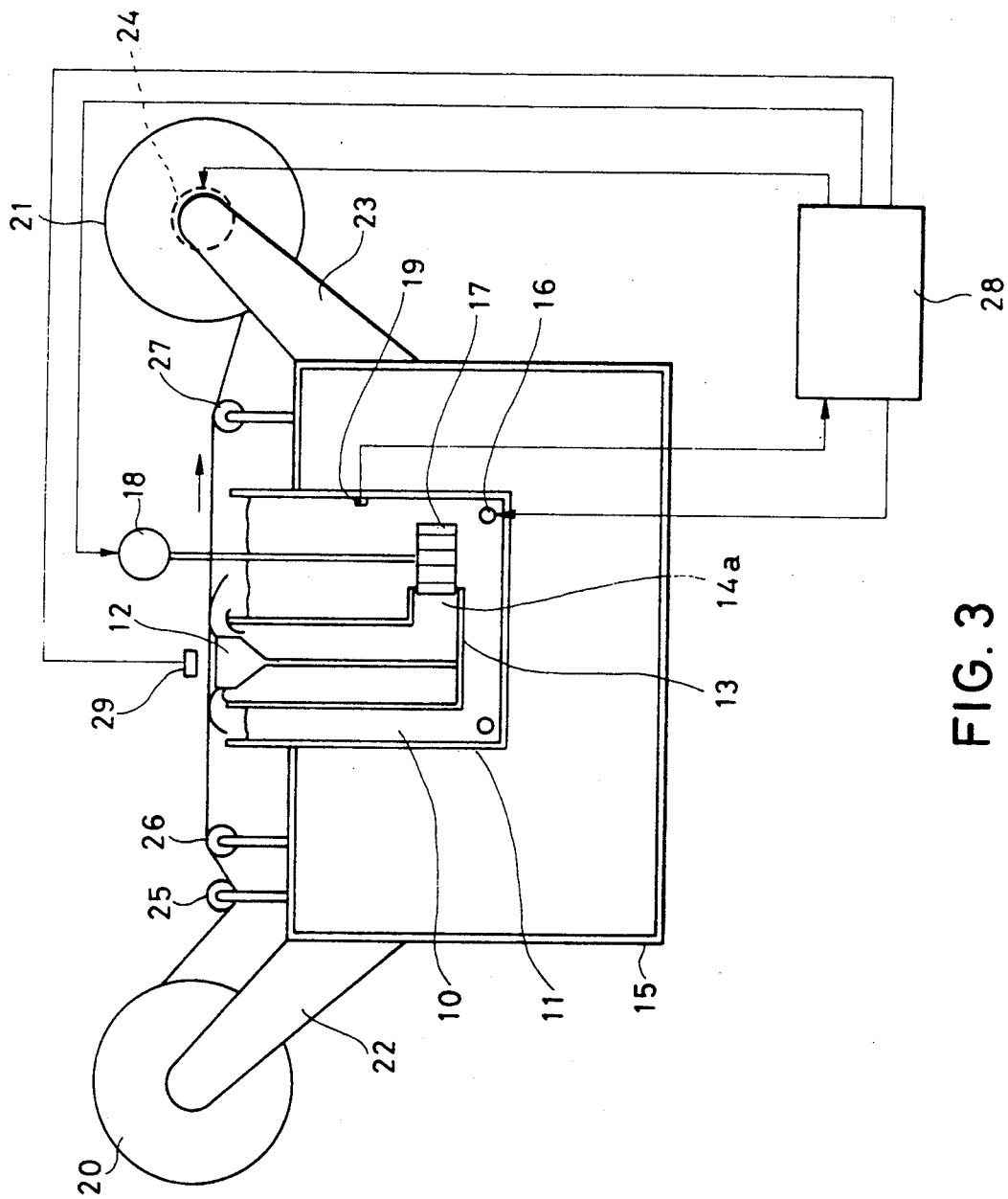
FIG. 3 is a schematic diagram of an embodiment of a solder coating apparatus.
Figure 4:
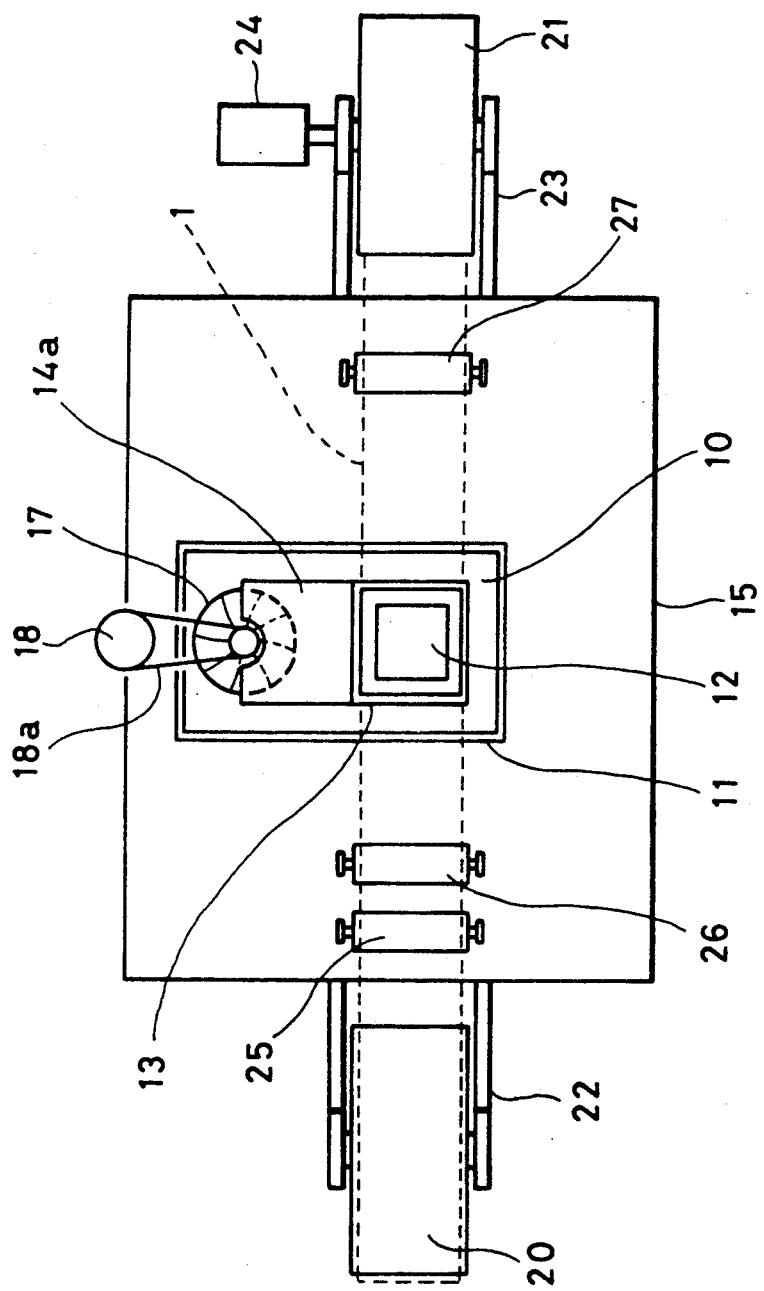
FIG. 4 is a schematic plan view of FIG. 3.

FIG. 3 is a sectional view schematically showing an embodiment of an apparatus for performing the solder coating method according to the present invention, and FIG. 4 is a plan view of FIG. 3. In the Figures, numeral 15 designates an apparatus proper having an open top, and a solder tank 11 containing a molten solder 10 is installed inside the apparatus proper. Arranged inside the solder tank 11 is a substantially L-shaped discharge tank 13 having an open top and an inlet opening 14a formed in the lower part for the molten solder 10. Also, a square pillar 12 is disposed inside the discharge tank 13 in such a manner that its top is slightly projected through the opening of the discharge tank 13 and gaps g are formed between the outer walls of the square pillar 12 and the inner walls of the discharge tank 13. Numeral 16 designates a heater provided in the lower part of the solder tank 11, and 17 a pressure feed screw for the molten solder 10 which is arranged in such a manner that its part is positioned in the inlet opening 14a of the discharge tank 13. The screw 17 is driven from a motor 18 through a belt 18a. Numeral 19 designates a temperature sensor disposed inside the solder tank 11.

Numeral 20 designates a product reel rotatably mounted on an arm 22 attached to the apparatus proper 15, and 21 a take-up reel similarly mounted on an arm 23 and driven by a motor 24. Numerals 25, 26 and 27 designate guide reels arranged on the apparatus proper 15 whereby a film 1 having semiconductor elements 5 mounted thereon and wound on the product reel 20 is taken up by the take-up reel 21 through the guide reels 25, 26 and 27.

Numeral 28 designates a controller for receiving an output signal of the temperature sensor 19 so that in accordance with the input signal the input power of the heater 16 is controlled in such a manner that the temperature of the molten solder 10 is maintained at a given temperature (e.g., 250°+5° C). Also, the controller 28 controls the motor 18 in such a manner that the molten solder 10 is intermittenly discharged from the discharge tank 13 and its discharge rate is held at a given rate (e.g., 480 cm$^3$/min) and it also controls the motor 24 so that the take-up rate of the film 1 by the take-up reel 21 is maintained at a given rate (e.g., 120 cm/min) and that each of the semiconductor elements 5 mounted on the film 1 is stopped above the discharged tank 13 for a given period of time. Numeral 29 designates a sensor for the semiconductor elements 5 mounted on the film 1 and its output signal is applied to the controller 28.

With the construction described above, the operation of the solder coating apparatus will now be described. With the semiconductor element 1 arranged in each of its device holes 2 and the electrodes 6 of each element 1 connected to the corresponding inner leads 3a, the film 1 is wound on the product reel 20 mounted on the arm 22, moved at a given speed in the direction of an arrow and taken up on the take-up reel 21. On the other hand, the solder within the solder tank 11 is heated by the heater 16 and thus the solder is in a molten state of about 250° C.+5° C. Then, when the film 1 is conveyed so that one of the semiconductor elements 5 arrives above the square pillar 12, this is detected by the sensor 29 and its output signal is sent to the controller 28. When the signal is received, the controller 28 sends a stop signal to the motor 24 of the take-up reel 21 so that the take-up reel 21 is stopped and the semiconductor element 5 is stopped above the square pillar 12.

Then, a signal is sent to the motor 18 from the controller 28 so that the pressure feed screw 17 is driven and the molten solder 10 within the solder tank 11 is forced into the discharge tank 13. When this occurs, the molten solder 10 is discharged in all directions through the gaps formed between the outer walls of the square pillar 12 and the inner walls of the discharged tank 13 so that the molten solder 10 overflows the discharge tank 13 and returns to the solder tank 11. At this time, a part of the molten solder 10 strikes against the film 10 and is deposited on the outer leads 3b on the four sides of the element 5.

When a given time has elapsed, a signal is sent to the motor 18 from the controller 28 so that the pressure feed screw 17 is stopped and the forced feeding of the molten solder 10 is stopped. Then, a signal is sent to the motor 24 so that the take-up reel 21 is driven and the film 1 is taken up. Thereafter, the above-mentioned operation is repeated intermittently and the solder is successively deposited on the outer leads 3b of the film 1 having the semiconductor elements 5 mounted thereon.

While, in the above-described embodiment, the sensor 29 detects that one of the semiconductor elements has arrived above the square pillar 12, the distance between the semiconductor elements 5 on the film 1 may be preliminarily stored in the controller 28 so that the take-up reel 21 takes up a length of the film 1 corresponding to this distance. Also, while, in this embodiment, the pressure feed screw 17 is used for forcing the molten solder 10 into the discharge tank 13, any other means may be used.

Further, where the solder is applied to the outer leads 3b of the film 1 which are formed on the two sides as shown in FIG. 5 by use of the present apparatus, it is only necessary to close the right and left gaps formed between the square pillar 12 and the discharge tank 13 of FIG. 4 and leave open only the upper and lower gaps. Further, where the present apparatus is used for applying the solder to the outer leads of a lead frame having semiconductor elements mounted thereon, the lead frame cannot be wound on the product reel and therefore it is necessary to provide conveying means capable of conveying the lead frame in the state of the flat sheet and stopping it intermittently.

From the foregoing detailed description it will be seen that by virtue of the fact that the molten solder is discharged from the solder tank in the two or four directions to effect in a single step the application of the solder to the corresponding outer leads of the film having the semiconductor elements mounted thereon, the present invention has the effect of not only reducing the solder coating time and improving the operating efficiency but also applying the solder to the outer leads of the film formed with the outer leads on the four sides easily and positively.

Further, by virtue of the fact that one of the semiconductor elements mounted on the film being conveyed is stopped above the square pillar to discharge the molten solder through the gaps formed between the square pillar and the discharge tank and thereby to deposit the molten solder on the outer leads, that after the lapse of a given period the discharge of the molten solder is stopped and the film is conveyed whereby when the next semiconductor element arrives above the square pillar, the conveying of the film is again stopped and the molten solder is discharged again, and that this series of operations are controlled by the controller, there is the effect of rapidly and accurately applying the solder to the outer leads and thereby improving the operating efficiency.

I claim:

1. A solder coating apparatus for semiconductor devices comprising:

a solder tank accommodating heating means, a discharge tank having an open top and including a solder inlet opening formed in a lower part thereof, a square pillar having a top formed to have substantially the same or slightly greater size than a plurality of semiconductor elements and arranged inside said discharge tank so as to project slightly beyond the open top thereof and to form at least two gaps between inner walls of said discharge tank and said square pillar, and solder pressure feed means arranged near to the inlet opening of said discharge tank;

conveying means for intermittently stopping a film having said semiconductor elements mounted thereon when one of said semiconductor elements arrives above said square pillar; and a controller for controlling at least said heating means, said solder pressure feed means, and said conveying means 2. A solder coating apparatus according to claim 1, wherein said gaps are formed only between opposing sides of said square pillar and said discharge tank.

* * * * *